(12) United States Patent
Mullins et al.

(10) Patent No.: US 10,940,814 B2
(45) Date of Patent: Mar. 9, 2021

(54) CUSTOMIZABLE MULTIFUNCTIONAL DISPENSER MODULE

(71) Applicant: The United States of America, as represented by the Secretary of the Navy, Crane, IN (US)

(72) Inventors: Marshall Andrew Mullins, Bloomington, IN (US); Charles Robert Upton, Jasper, IN (US); Mark Alan Anderson, Springville, IN (US); Timothy Bradley, Loogootee, IN (US); Eric Alan Hillenbrand, Evansville, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/683,914

(22) Filed: Nov. 14, 2019

(65) Prior Publication Data
US 2020/0148140 A1 May 14, 2020

Related U.S. Application Data

(60) Provisional application No. 62/767,255, filed on Nov. 14, 2018.

(51) Int. Cl.
*B60L 1/00* (2006.01)
*B60L 3/00* (2019.01)
*H02G 3/00* (2006.01)
*B60R 16/03* (2006.01)
*H03K 19/20* (2006.01)

(52) U.S. Cl.
CPC ............. *B60R 16/03* (2013.01); *H03K 19/20* (2013.01)

(58) Field of Classification Search
CPC ................................ B60R 16/03; H03K 19/20
USPC ........................................................ 307/10.1
See application file for complete search history.

(56) References Cited

U.S. PATENT DOCUMENTS 5,773,749 A * 6/1998 Cotton, III .............. F41A 19/65
102/200

\* cited by examiner

*Primary Examiner* — Richard Tan
(74) *Attorney, Agent, or Firm* — Naval Surface Warfare Center, Crane Division; Eric Van Wiltenburg

(57) ABSTRACT

The present invention relates to a dispenser module for converting preexisting analog systems into a customizable digital system. According to an illustrative embodiment of the present disclosure, a user can utilize preexisting analog equipment to operate and control a dispenser module. A squib is electrically connected to a logic circuit such that the normal "firing" of the original payload at that location will cause a change in the state of the electrical circuit. Because there are multiple payload allocations within one module, this allows electrical communication with individual/select payload devices by an operator. Payloads in the module can be quickly swapped in and out without making any changes to the vehicle.

5 Claims, 4 Drawing Sheets

CUSTOMIZABLE MULTIFUNCTIONAL DISPENSER MODULE

CROSS-REFERENCE TO RELATED APPLICATIONS

The present application claims priority to U.S. Provisional Patent Application Ser. No. 62/767,255, filed Nov. 14, 2018, entitled "Customizable Multifunctional Dispenser Module Smart Box," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,569) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The present invention relates to modular equipment adapters for switching vehicle payloads.

BACKGROUND AND SUMMARY OF THE INVENTION

The present invention relates to a dispenser module for converting preexisting analog systems into a customizable digital system. In many vehicles (e.g., all-terrain vehicles, aircraft, etc.) there is very little space for adding additional equipment. To install new systems on older vehicles, one would need to strip out old systems and possibly overhaul the entire vehicle to make it compatible with the new equipment, particular for digital equipment. The time and cost of retrofitting such a vehicle is cost prohibitive.

According to an illustrative embodiment of the present disclosure, a user can utilize preexisting analog equipment to operate and control a dispenser module. A squib is electrically connected to a logic circuit such that the normal "firing" of the original payload at that location will cause a change in the state of the electrical circuit (e.g., 1 or 0, or on/off). Because there are multiple payload allocations within one module, this allows electrical communication with individual/select payload devices by an operator. Payloads in the module can be quickly swapped in and out without making any changes to the vehicle. This can allow a user to operate a wide variety of components within and outside the dispenser system using the same system. This gives the vehicle the ability to have new equipment attached to the vehicle via the dispenser housing, which helps to reduce the time and expense typically spent in vehicle modifications. This also significantly reduces mandatory documentation and testing that is required for any aircraft modification.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
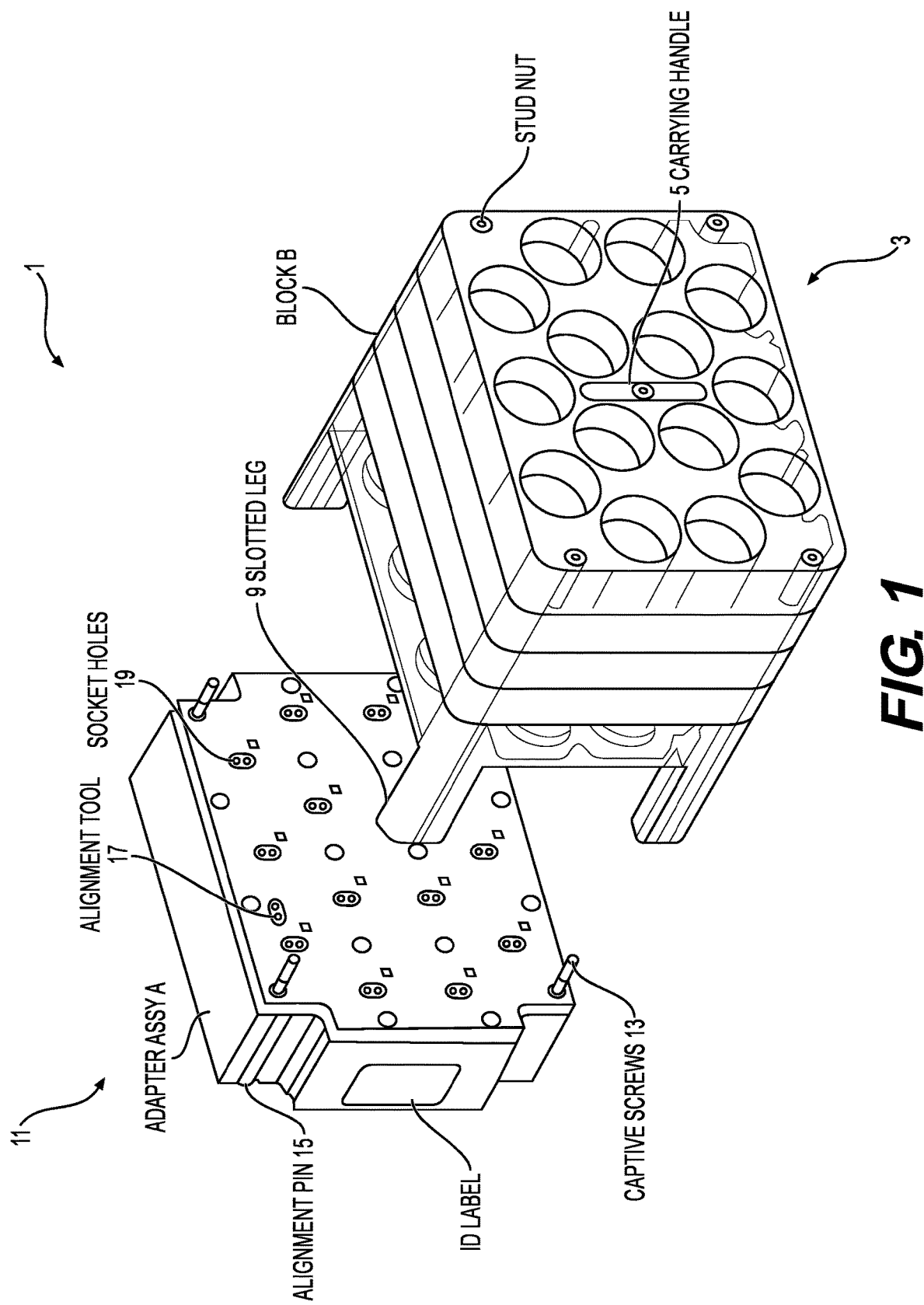
FIG. 1 shows an exploded view of an exemplary dispenser module.

FIG. 1 shows an exploded view of an exemplary dispenser module 1 with a housing structure 3 and adapter assembly 11. Slotted legs 9 on housing structure 3 couple to captive screws 13 on adapter assembly 11. Housing structure 3 stores payloads (not shown) and contact squibs (not shown) within a plurality of cavities. Wires and cables can be strung through a plurality of socket apertures 19 to allow connections between a vehicle and payloads. A carrying handle 5 facilitates transport and swapping of modules. Align pin 15 and alignment tool 17 facilitate coupled between housing structure 3 and adapter assembly 11.

Figure 2:
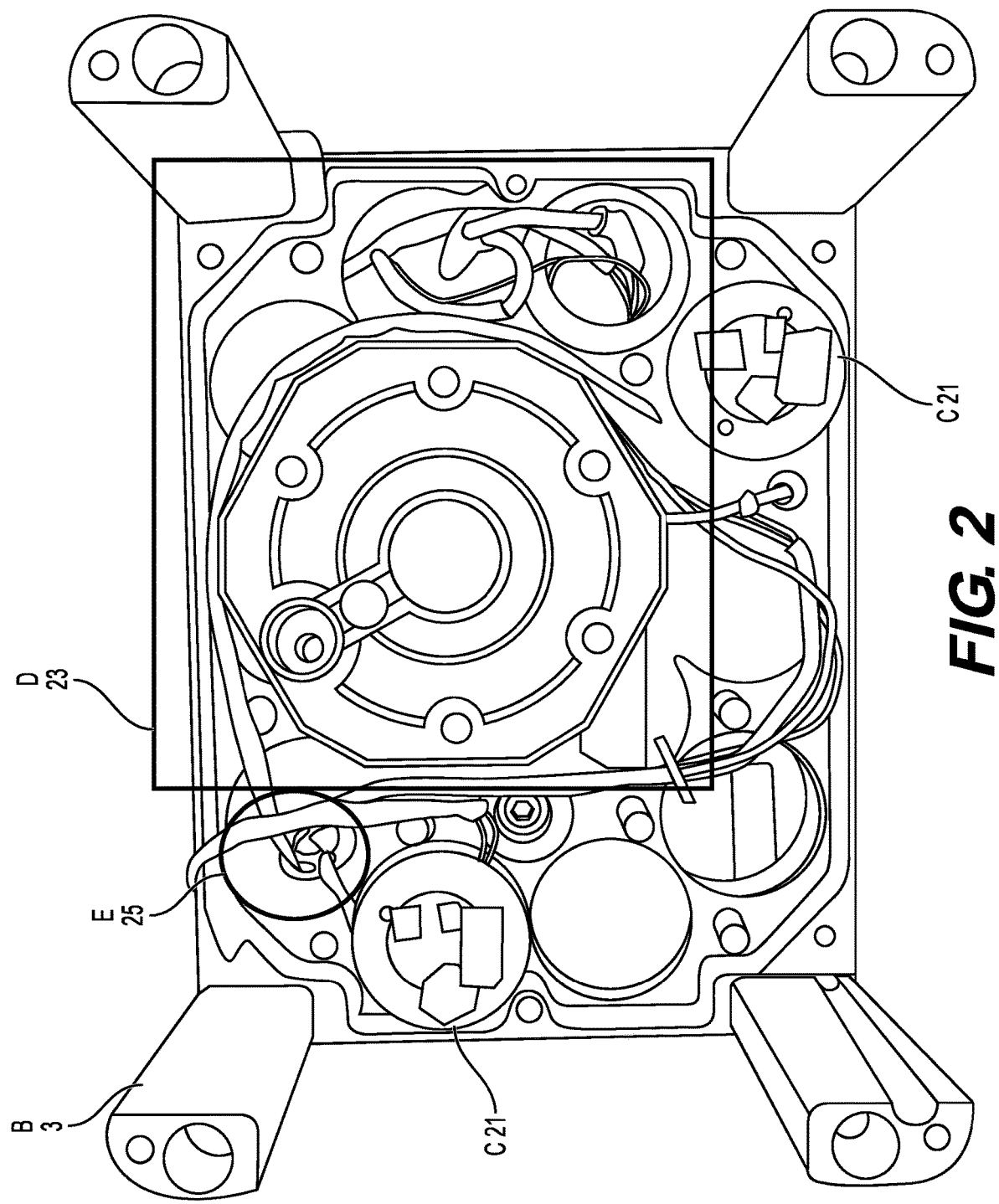
FIG. 2 shows a bottom side view of an exemplary housing structure.

FIG. 2 shows a bottom side view of an exemplary housing structure 3. Payload 23 and at least one contact squib 21 are housed within housing structure 3. Logic circuit 25 electrically couples the at least one contact squib 21 to the payload 23. The at least one contact squib 21 is connected to a vehicle such that activating a switch on the vehicle will activate a contact squib. The contact squib then sends an electrical signal to the payload (e.g., a light source) through logic circuit 25 to activate the payload (e.g., turning on the light source). In this manner, any desired payload can be installed and activated with the same equipment. Logic circuit 25 can be configured to activate any number of payload items, but the simplest approach is for one activated squib to activate a single payload item. A more complex approach can be to configure logic circuit 25 such that the activation of multiple squibs 21 can activate different payload items/configurations/combinations. In exemplary embodiments, logic circuit 25 may implement a processor and data storage device to allow storage of software that runs processes in response to receiving signals from squibs 21.

Figure 3:
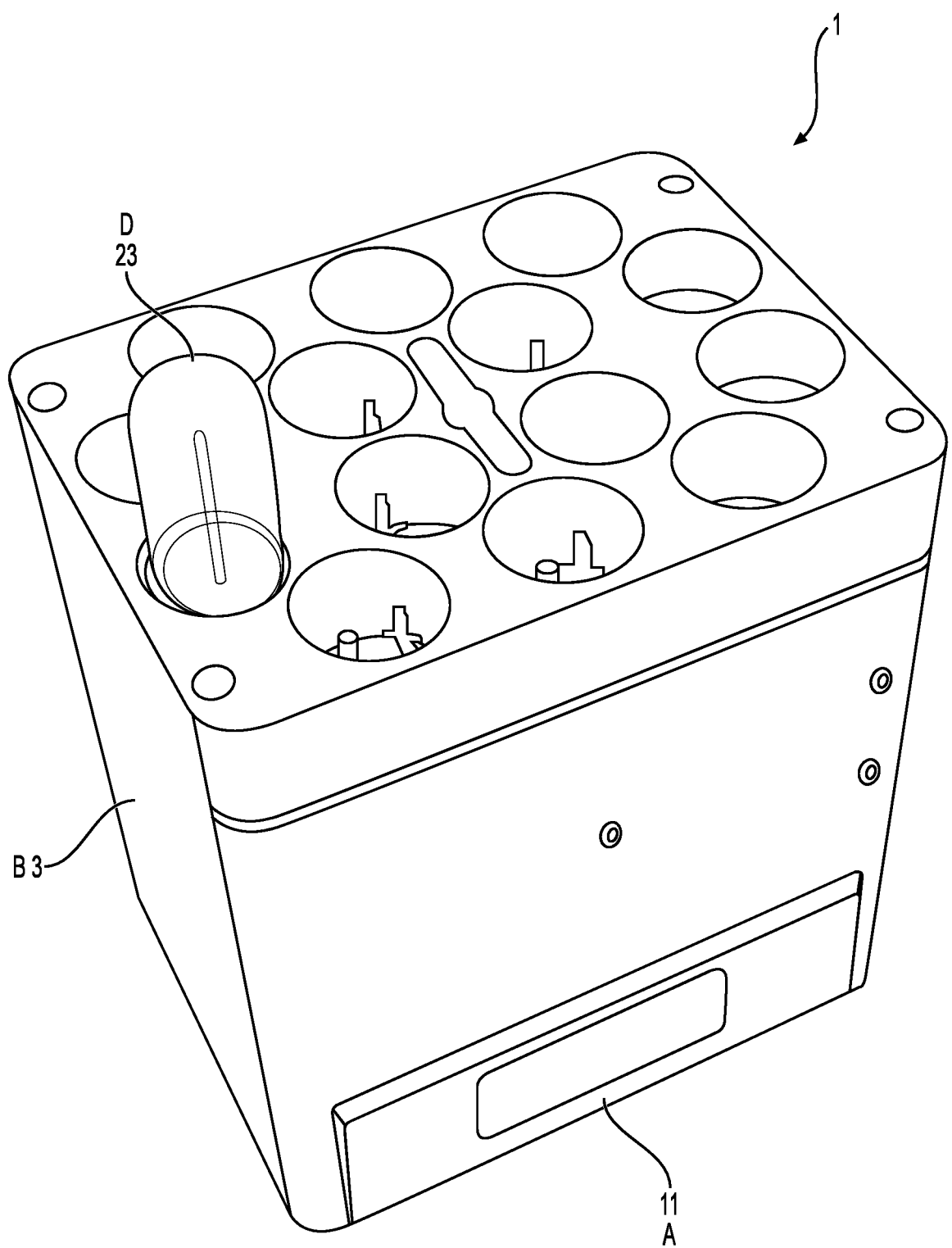
FIG. 3 shows an isometric view of an assembled dispenser module.

FIG. 3 shows an isometric view of an assembled dispenser module 1 with a housing structure 3 coupled to an adapter assembly 11. Payload 23 is shown installed in housing structure 3. Dispenser module 1 is ready to be installed into a vehicle such that activating an analog signal on the vehicle will activate payload 23.

Figure 4:
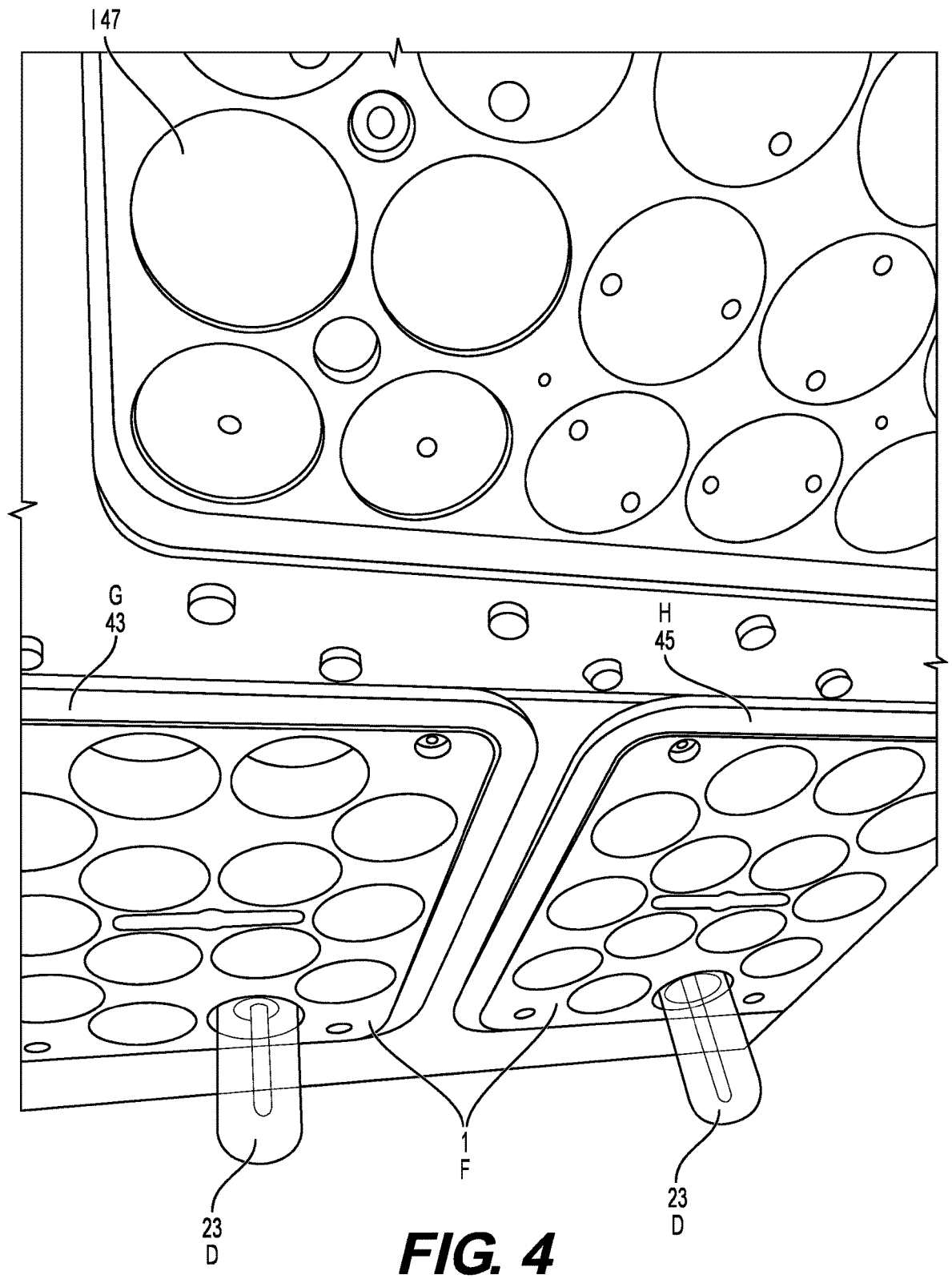
FIG. 4 shows an exemplary dispenser module installed in a vehicle.

FIG. 4 shows an exemplary dispenser modules 1 and original analog equipment 47 installed in a vehicle 45. Vehicle housing 43 couples to dispenser module 1 to secure the module 1 to the vehicle 45. Payload 23 is shown installed in dispenser modules 1. In alternative embodiments, a dispenser module 1 can house a mixture of payloads activated digitally through a contact squib and original analog payloads.

Although the invention has been described in detail with reference to certain preferred embodiments, variations and modifications exist within the spirit and scope of the invention as described and defined in the following claims.

The invention claimed is:

1. A adapter system comprising:
   a housing structure comprising a plurality of payload cavities;
   an adapter assembly configured to receive a plurality of analog signals from an external device or system, wherein the housing structure is removably coupled to the adapter assembly;
   at least one logic insert, wherein the at least one logic insert is formed to fit between the housing structure and the adapter assembly, wherein the at least one logic insert is configured to generate a digital signal after receiving an analog signal from the external device or system.

2. The adapter system of claim 1, further comprising:
   at least one payload, wherein the at least one payload is insertably coupled to the plurality of payload cavities, wherein the at least one payload is electrically coupled to the at least one logic insert.

3. The adapter system of claim 2, further comprising the external device or system, wherein the adapter assembly is removably coupled to the external device or system.

4. The adapter system of claim 2, further comprising:
   at least one analog payload, wherein the at least one analog payload is insertably coupled to the plurality of payload cavities, wherein the at least one analog payload is configured to couple to the external device or system.

5. The adapter system of claim 1, further comprising:
   a data storage device storing a plurality of machine readable instructions;
   a processor, wherein the processor and data storage device are electrically coupled to the at least one logic insert;
   wherein the processor is configured to execute the plurality of machine readable instructions after receiving the digital signal.

* * * * *